United States Patent
Pomerene et al.

(10) Patent No.: US 8,513,037 B2
(45) Date of Patent: Aug. 20, 2013

(54) METHOD OF INTEGRATING SLOTTED WAVEGUIDE INTO CMOS PROCESS

(75) Inventors: Andrew T S Pomerene, Leesburg, VA (US); Craig M. Hill, Warrenton, VA (US); Timothy J. Conway, Gainesville, VA (US); Stewart L. Ocheltree, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/580,872

(22) PCT Filed: Dec. 2, 2011

(86) PCT No.: PCT/US2011/062979
§ 371 (c)(1),
(2), (4) Date: Aug. 23, 2012

(87) PCT Pub. No.: WO2012/075350
PCT Pub. Date: Jun. 7, 2012

(65) Prior Publication Data
US 2012/0322177 A1    Dec. 20, 2012

Related U.S. Application Data

(60) Provisional application No. 61/419,457, filed on Dec. 3, 2010.

(51) Int. Cl.
*H01P 1/15*    (2006.01)
(52) U.S. Cl.
USPC ........................................................... 438/31

(58) Field of Classification Search
USPC .......... 438/31, 22, 48; 257/E33.06, E21.119; 385/14
See application file for complete search history.

(56) References Cited

U.S. PATENT DOCUMENTS

| | | | |
|---|---|---|---|
| 5,604,835 A * | 2/1997 | Nakamura et al. | 385/129 |
| 6,968,110 B2 * | 11/2005 | Patel et al. | 385/131 |
| 7,072,556 B1 | 7/2006 | Gunn, III et al. | |
| 7,109,051 B2 * | 9/2006 | Cave et al. | 438/29 |
| 7,453,132 B1 | 11/2008 | Gunn, III et al. | |
| 7,738,753 B2 * | 6/2010 | Assefa et al. | 385/49 |
| 7,785,983 B2 * | 8/2010 | Zia et al. | 438/427 |
| 8,213,751 B1 * | 7/2012 | Ho et al. | 385/14 |
| 8,260,151 B2 * | 9/2012 | Pelley et al. | 398/200 |
| 8,288,290 B2 * | 10/2012 | Carothers | 438/718 |
| 2005/0054131 A1 * | 3/2005 | Wada et al. | 438/31 |
| 2005/0104684 A1 * | 5/2005 | Wojcik et al. | 333/108 |
| 2006/0105508 A1 | 5/2006 | Zia et al. | |

(Continued)

*Primary Examiner* — Jarrett Stark
*Assistant Examiner* — Michele Fan
(74) *Attorney, Agent, or Firm* — Daniel J. Long

(57) ABSTRACT

A method for integrating a slotted waveguide into a CMOS process is disclosed. A slot can be patterned on a SOI wafer by etching a first pad hard mask deposited over the wafer. The slot is then filled with a nitride plug material by depositing a second pad hard mask over the first pad hard mask. A waveguide in association with one or more electronic and photonic devices can also be patterned on the SOI wafer. The trenches can be filled with an isolation material and then polished. Thereafter, the first and second pad hard masks can be stripped from the wafer. The slot can once again be filled with the nitride plug material and patterned. After forming one or more electronic and photonic devices on the wafer using a standard CMOS process, a via can be opened down to the nitride plug and the nitride plug can then be removed.

10 Claims, 15 Drawing Sheets

(56) References Cited

U.S. PATENT DOCUMENTS

| | | |
|---|---|---|
| 2009/0111200 A1 | 4/2009 | Carothers et al. |
| 2009/0297091 A1* | 12/2009 | Assefa et al. ............ 385/14 |
| 2011/0037133 A1* | 2/2011 | Su et al. ............ 257/432 |
| 2011/0158582 A1* | 6/2011 | Su et al. ............ 385/14 |
| 2012/0129302 A1* | 5/2012 | Assefa et al. ............ 438/154 |

\* cited by examiner

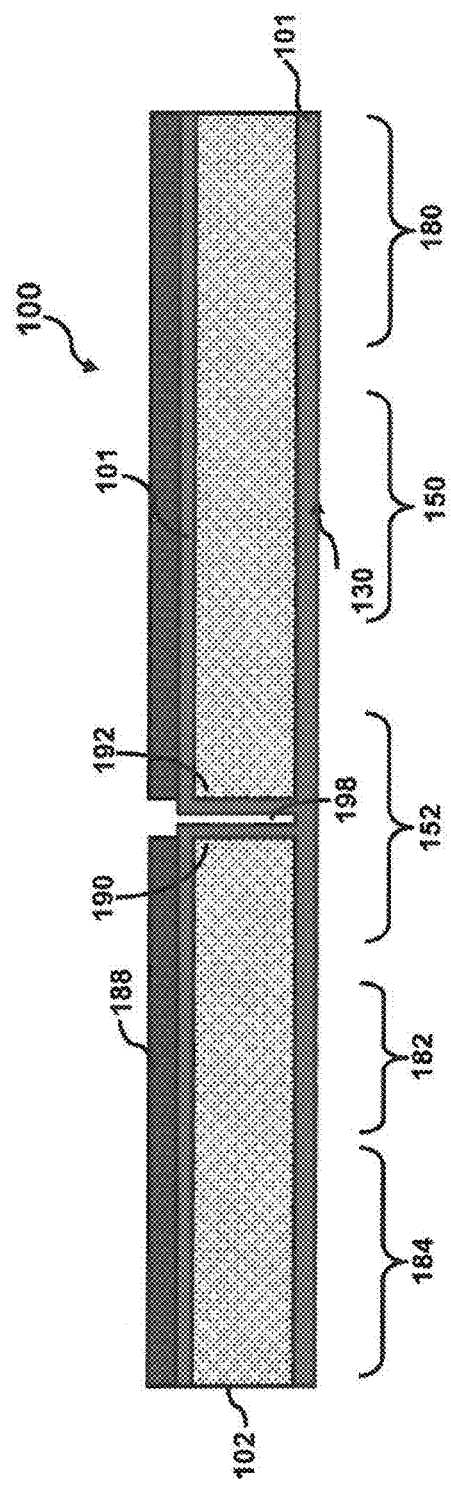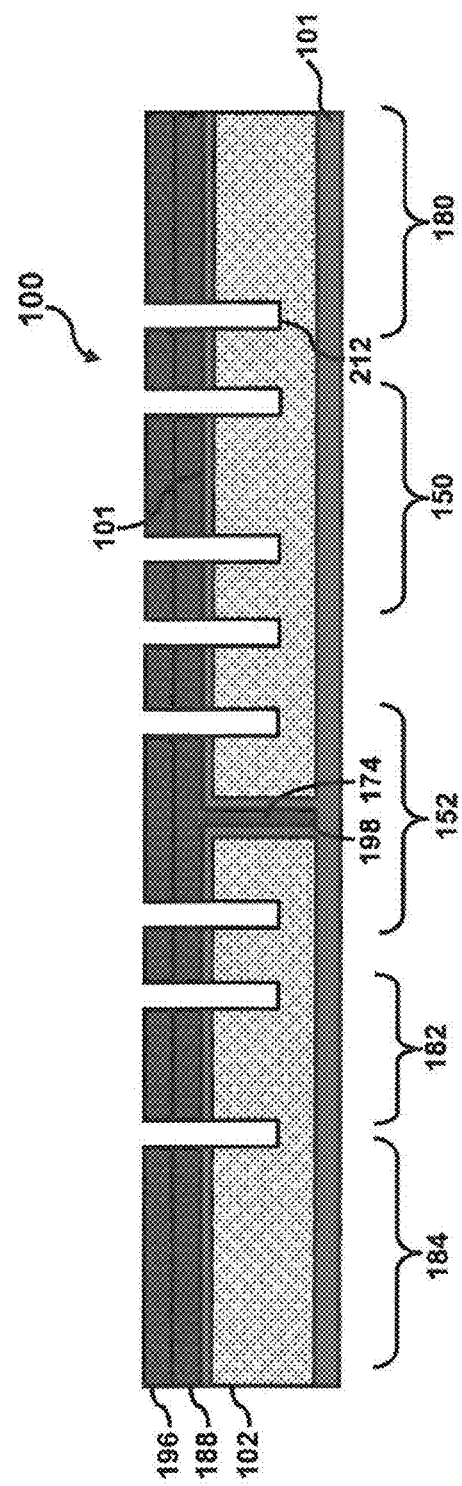

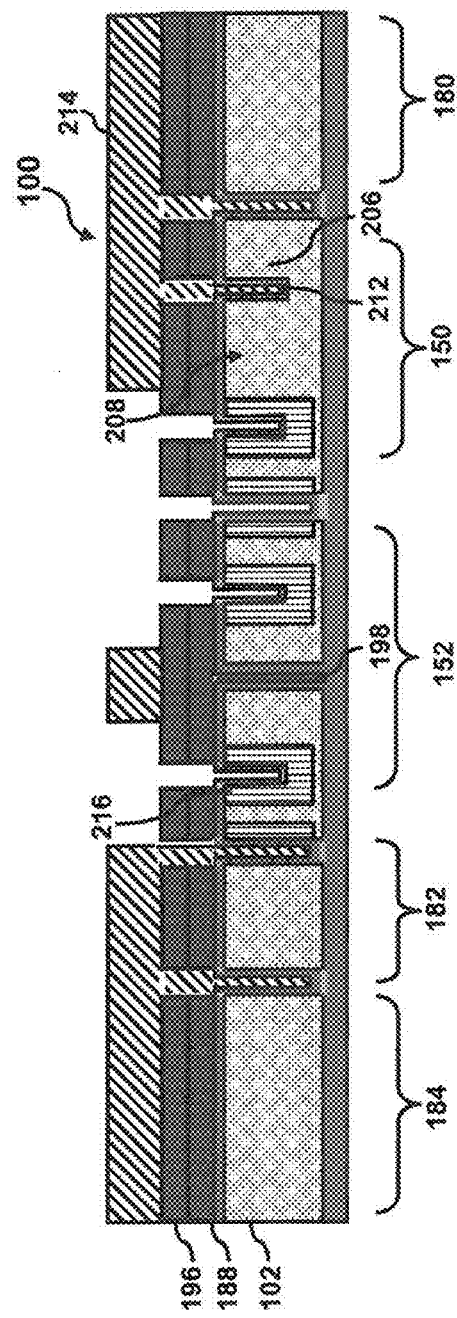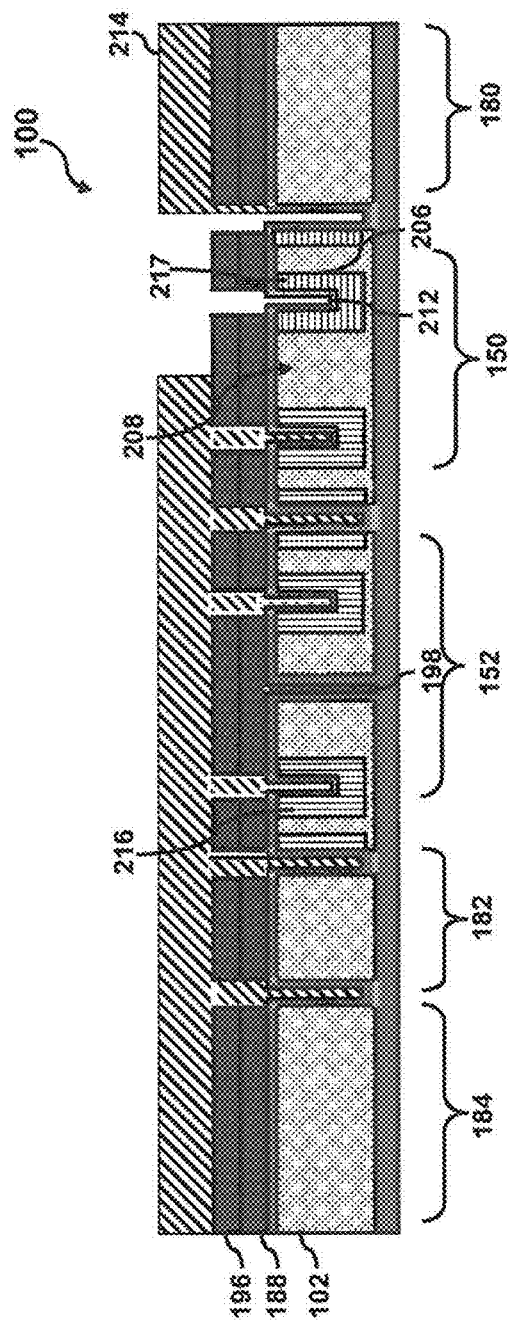

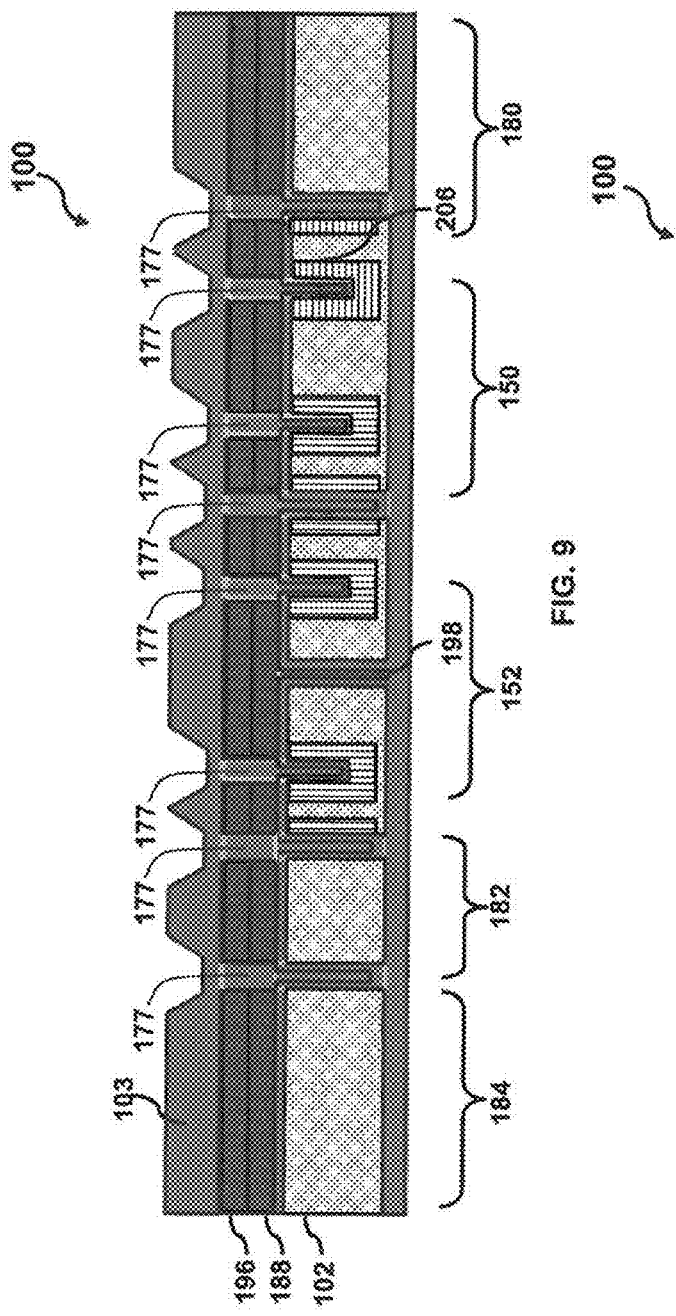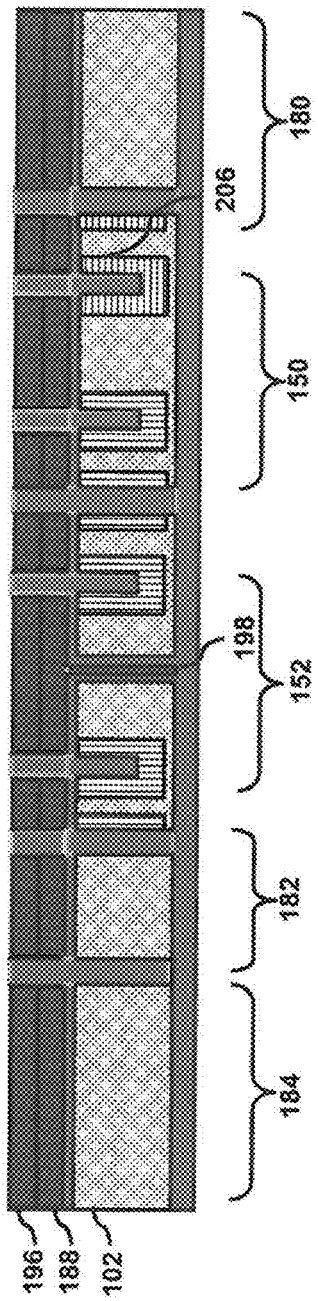
FIG. 9
FIG. 10

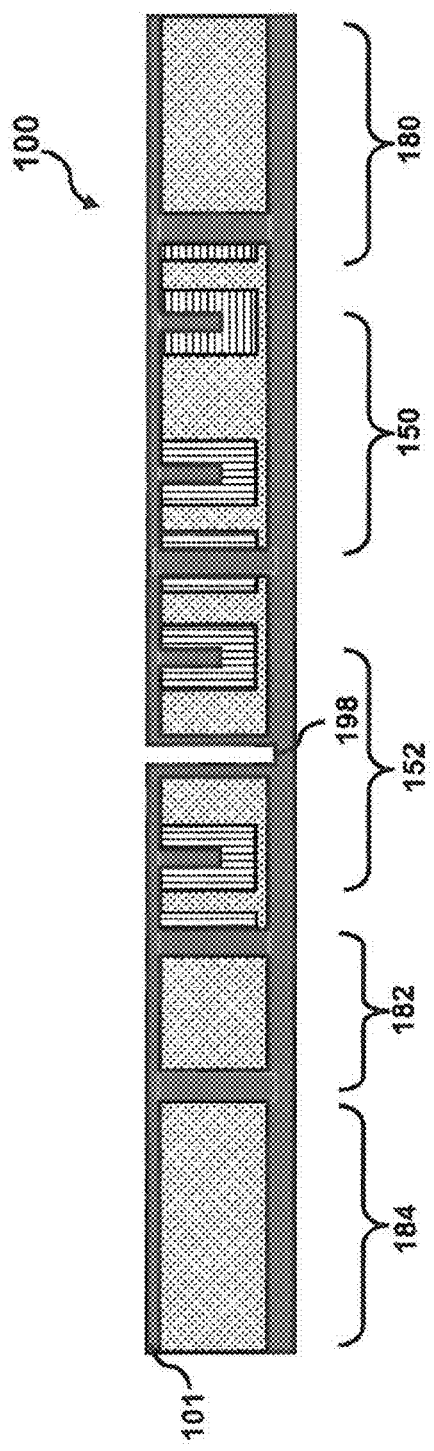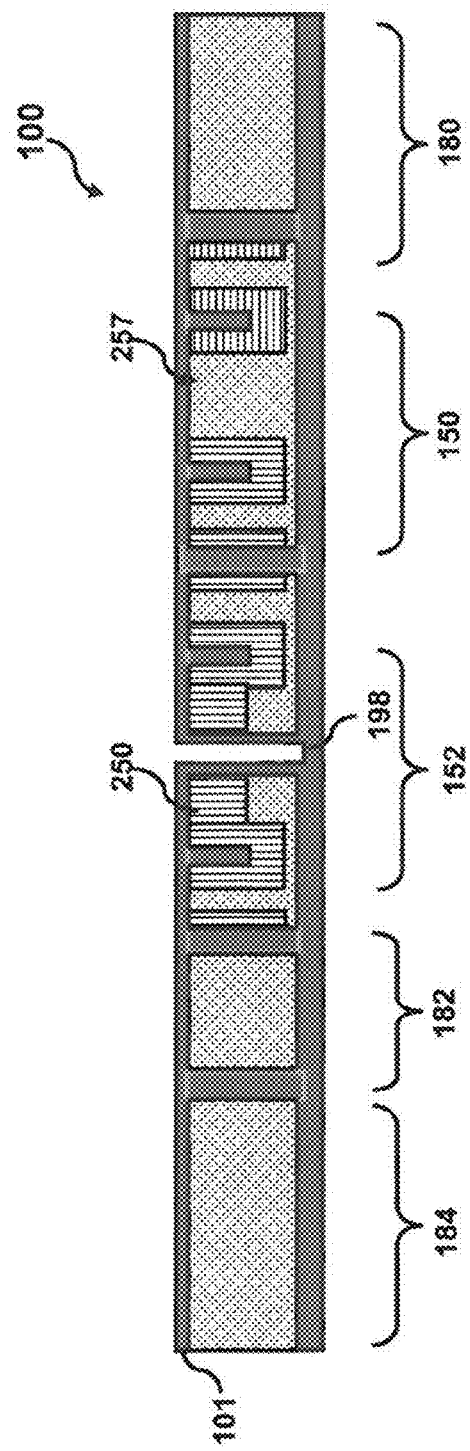

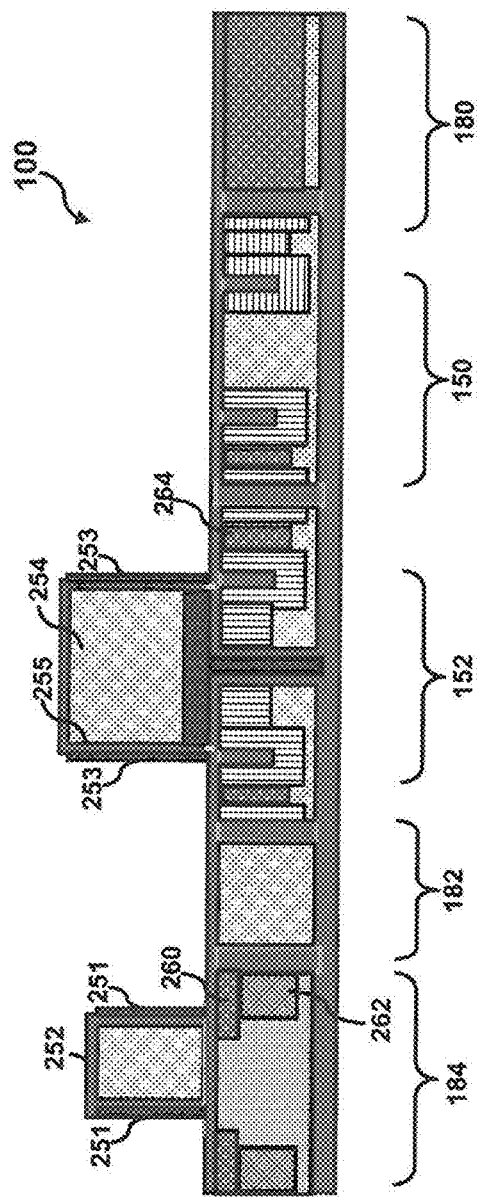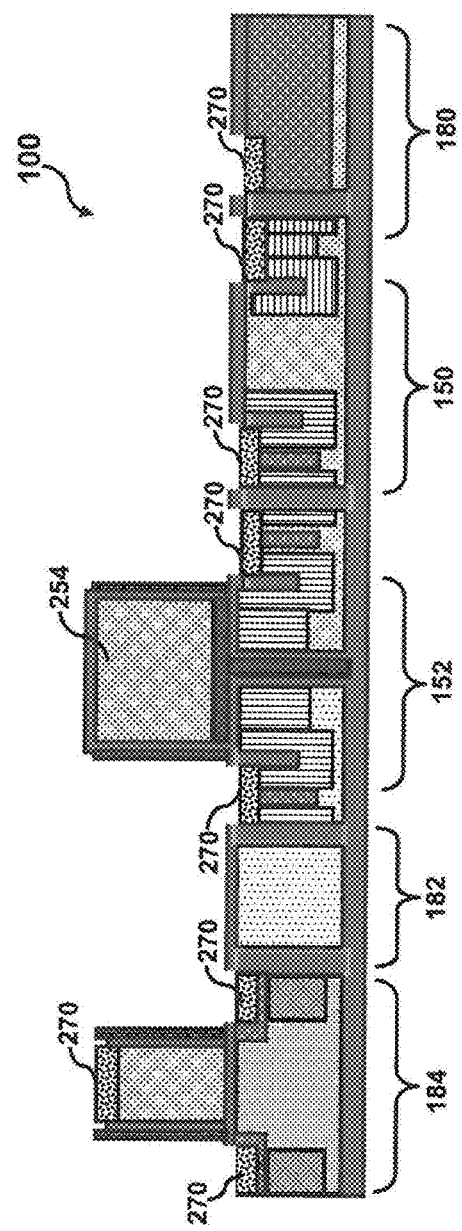

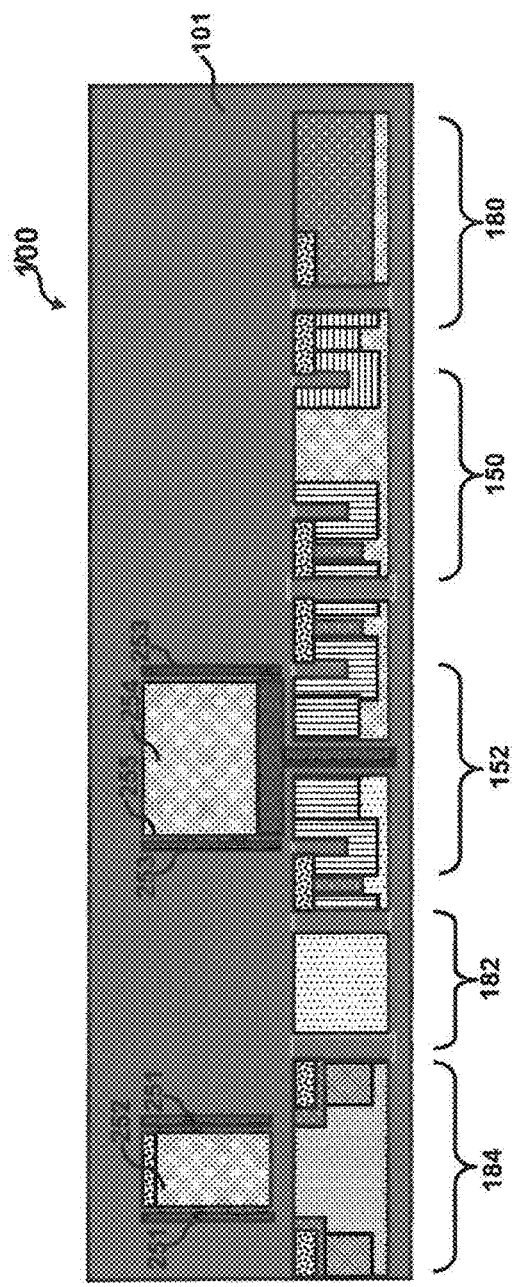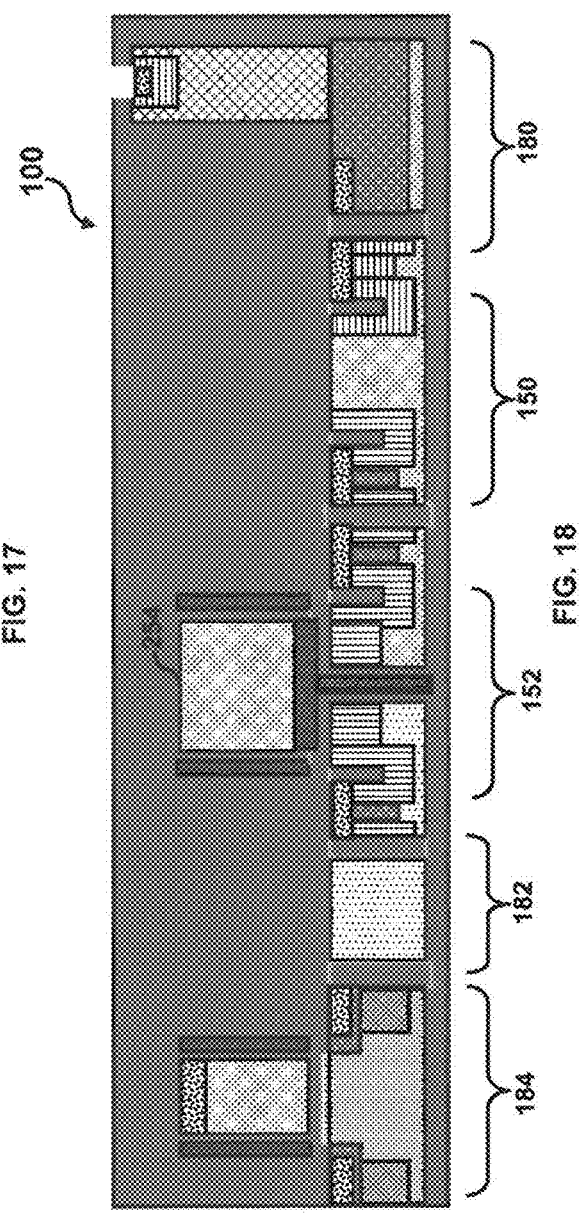

METHOD OF INTEGRATING SLOTTED WAVEGUIDE INTO CMOS PROCESS

This Application claims rights under 35 USC §119(e) from U.S. application Ser. No. 61/419,457 filed 3 Dec. 2010 the contents of which are incorporated herein by reference.

TECHNICAL FIELD

Embodiments are generally related to integrated circuit devices and methods of fabricating the same. Embodiments are also related to fabrication of waveguides used in electronic and photonic process. Embodiments are additionally related to a method for integrating slotted waveguide into complementary-metal oxide semiconductor (CMOS) process.

BACKGROUND OF THE INVENTION

Complementary metal-oxide-semiconductor (CMOS) can be utilized for constructing integrated circuits and devices for example microprocessors, microcontrollers, static RAM, and other digital logic circuits. CMOS technology can also be employed in the field communication for manufacturing several analog circuits such as image sensors (CMOS sensor), data converters, and highly integrated transceivers. Multi-level thin film processing, global planarization and advanced photolithography techniques utilized in CMOS processing enables the ability to integrate complimentary electronic and photonic components within a single CMOS process flow.

Silicon-On-Insulator (SOI) structures may be used to fabricate various photonic devices such as optical waveguides over a silicon substrate and to integrate silicon electronics such as CMOS circuits on the same silicon platform with the photonic devices. Waveguides are frequently used in electronic/photonic processes. A slotted waveguide is a waveguide that is used as an antenna in microwave radar applications. A slotted waveguide has no reflector but emits directly through the slots. The spacing of the slots is critical and is a multiple of the wavelength used for transmission and reception. Integration of such silicon-based structures, devices and materials with photonic devices and elements that generate, guide, control, modulate, or detect light has been under extensive research and development. A need therefore exists for an improved method to integrate a slotted waveguide into a CMOS process.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the present invention to provide for an improved integrated circuit devices and methods.

It is another aspect of the disclosed embodiment to provide for an improved method for fabricating waveguides used in electronic and photonic processes.

It is a further aspect of the disclosed embodiment to provide for an improved method for integrating a slotted waveguide into a complementary-metal oxide semiconductor (CMOS) process.

The aforementioned aspects and other objectives and advantages can now be achieved as described herein. A method for integrating a slotted waveguide into a complementary-metal oxide semiconductor (CMOS) process is disclosed. A slot can be patterned on a Silicon-On-Insulator (SOI) wafer by etching a first pad hard mask deposited over the SOI wafer and performing a liner oxidation process. The slot can be filled with a plug material by depositing a second pad hard mask over the first pad hard mask. A waveguide in association with one or more electronic and photonic devices for example, a slot modulator, a Field Effect Transistor (FET), a ring modulator and a Germanium detector can also be patterned on the SOI wafer by utilizing the standard CMOS process. After patterning, the trenches are filled with an isolation material and the excess isolation material can then be removed by polishing the wafer. Thereafter, the first and the second pad hard masks can be stripped from the wafer and the slot can once again be filled with the plug material and patterned. As the slot is closed with the plug material, one or more electronic and photonic devices for example, slot modulator, ring modulator and Germanium detector can be formed by using the standard CMOS process. Then, a via can be opened up down to the plug material by etching process and the plug material can be removed.

Since the waveguide is opened at the end, a variety of films maybe deposited into the slot, such as an electro-optic polymer. The process also allows for other opening to the top of the waveguides, which enables bonding of the optical sources and the detectors to the waveguides. The plug material preserves the slots, so that the slot may be opened at the end of the line. The plug material also serves as an etch stop, when later exposing the plug and clearing out the slot.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the invention, serve to explain the principles of the disclosed embodiments.

FIG. 3 illustrates a cross sectional view of the CMOS wafer illustrating the slot etching and the slot liner oxidation process, in accordance with the disclosed embodiments;

FIG. 4 illustrates a cross sectional view of the CMOS wafer with a nitride plug, in accordance with the disclosed embodiments;

FIGS. 5-8 illustrate cross sectional views of the CMOS wafer showing the steps involved in the formation of implants for the ring modulator and the slot modulator in a standard CMOS process;

FIG. 9 illustrates a cross sectional view of the CMOS wafer depicting the shallow-trench isolation filling process, in accordance with the disclosed embodiments;

FIG. 10 illustrates a cross sectional view of the CMOS wafer showing the trench planarization process, in accordance with the disclosed embodiments;

FIG. 11 illustrates a cross sectional view of the CMOS wafer illustrating the pad nitride stripping process, in accordance with the disclosed embodiments;

FIG. 12 illustrates a cross sectional view of the CMOS wafer showing the formation of implants for the slot modulator using the standard CMOS process;

FIGS. 15-19 illustrate cross sectional views of the CMOS wafer showing the process of formation of a CMOS active area and the Germanium detector using the standard CMOS process;

DETAILED DESCRIPTION

The particular values and configurations discussed in these non-limiting examples can be varied and are cited merely to illustrate at least one embodiment and are not intended to limit the scope thereof.

The invention discloses a method for integrating a slotted waveguide into a CMOS process to enable fabrication of the slotted waveguides over a silicon substrate and to integrate silicon electronics such as CMOS circuits on the same silicon platform with the photonic devices. The method enables the fabrication of electronic and photonic devices for example a FET, a slot modulator, a waveguide, a slotted waveguide, a germanium detector and a ring modulator in a single CMOS wafer.

Figure 1:
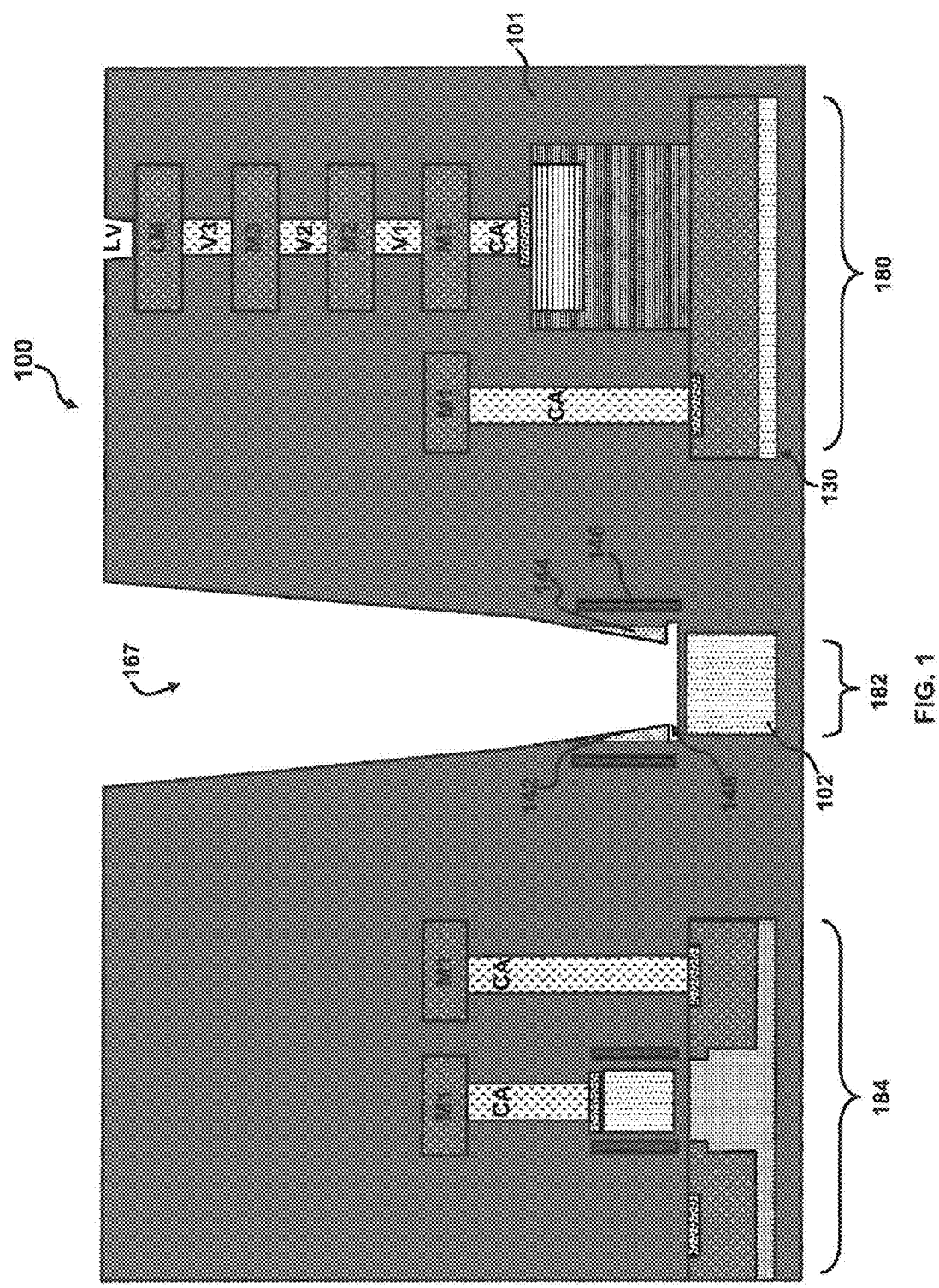
FIG. 1 illustrates a cross sectional view of a CMOS wafer showing a Field Effect Transistor (FET), a waveguide and a Germanium detector, in accordance with the disclosed embodiments.

FIG. 1 is a cross sectional view of a CMOS wafer 100, illustrating the formation of a Field Effect Transistor (FET) 184, a waveguide 182 and a Germanium (Ge) detector 180, in accordance with the disclosed embodiments. The CMOS wafer 100 includes an epitaxial silicon substrate 102, preferably made of silicon, and the electronic and photonic devices such as the FET 184, the waveguide 182 and the Germanium detector 180 formed over the substrate 102. The substrate 102 can be for example a SOI substrate. The waveguide 182 includes a ploy etch stop 142, a nitride spacer 146, a plug region 148 and a polysilicon plug 144. An oxide layer 101 formed over the waveguide 182 is etched to create an opening 167. The nitride spacer 146 can be utilized for making the opening 167 for the waveguide 182. The CMOS wafer 100 further includes a Buried OXide (BOX) layer 130. The FET 184 and the Germanium (Ge) detector 180 can be manufactured using the standard CMOS process.

Figure 2:
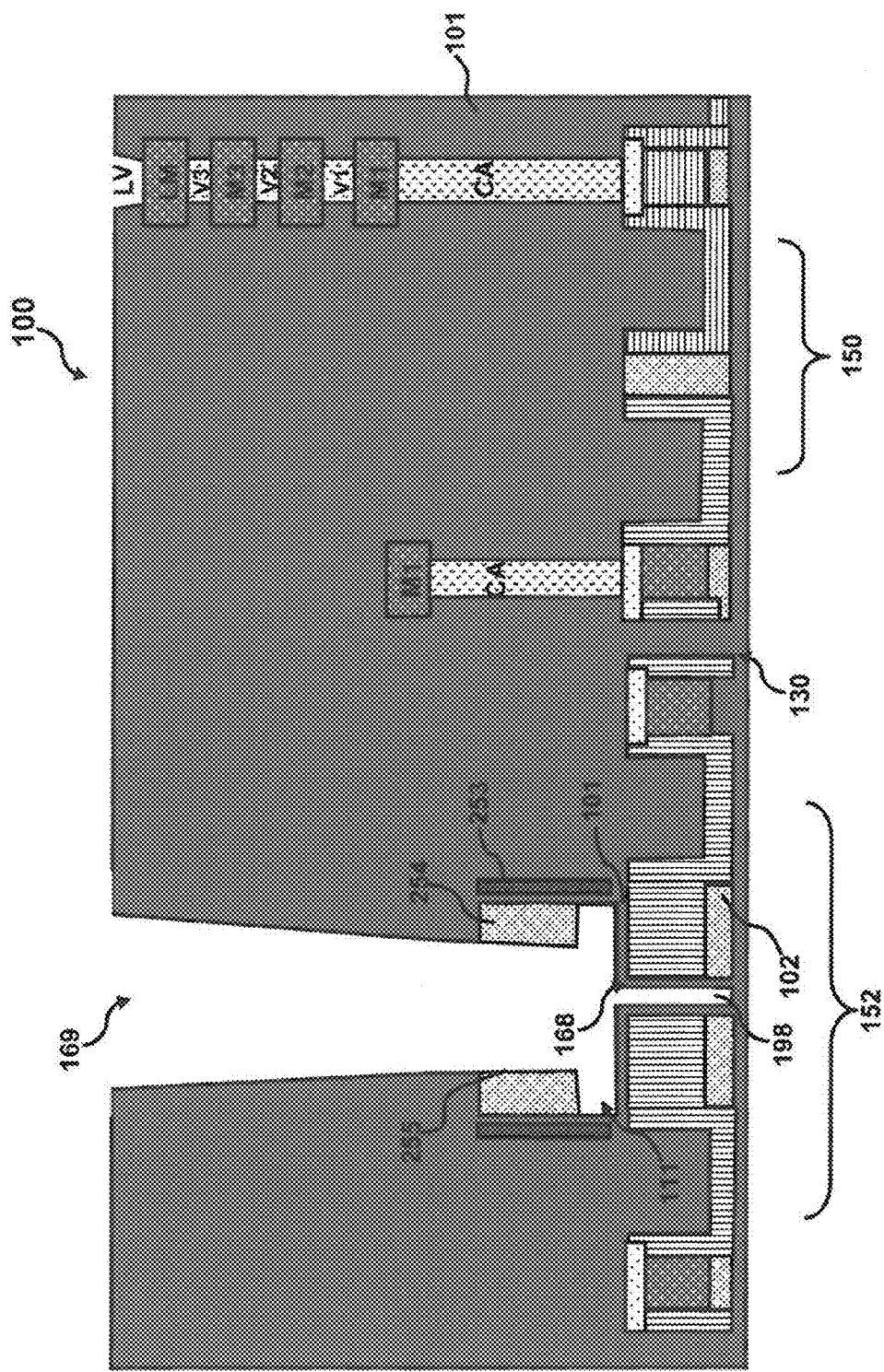
FIG. 2 illustrates a cross sectional view of the CMOS wafer showing a slot modulator and a ring modulator, in accordance with the disclosed embodiments.

FIG. 2 shows the formation of a ring modulator 150 and the slot modulator 152. The slot modulator 152 includes a nitride spacer 253, a plug region 111, a polysilicon plug 254 and a poly etch stop layer 255 to form a slot 198 on the wafer 100. The slot opening 169 generally opens regions to the slot 198 and top of the substrate 102. The thickness of the oxide layer 101 on the top and side regions 168 of the slot 198 is approximately one hundred and fifty Angstrom. Note that the ring modulator 150 and the slot modulator 152 can be manufactured using the standard CMOS process.

Referring to FIGS. 3-22, various electronic and photonic devices such as the CMOS active area 184, the waveguide 182, the slot modulator 152, the ring modulator 150 and the Germanium detector 180 are formed in the substrate 102 as shown. FIG. 3 illustrates a cross sectional view of the CMOS wafer 100 showing the slot etching and slot liner oxidation process, in accordance with the disclosed embodiments. After depositing a first pad nitride hard mask 188 over the substrate 102, the slot 198 is formed by etching process and then slot liner oxidation is performed. FIG. 3 also shows an N doped sidewall implant 190, a P doped sidewall implant 192 and the oxide layer 101. Note that the CMOS active area and FET are generally referred by the same reference numeral 184.

In general, etching is used in microfabrication to chemically remove layers from the surface of a wafer during manufacturing. Etching is an important process module, and every wafer undergoes many etching steps before it is complete. For many etch steps, part of the wafer is protected from the etchant by a "masking" material which resists etching. In some cases, the masking material is a photoresist which has been patterned using photolithography. Other situations require a more durable mask, such as silicon nitride. Also, isolation structures are formed in an integrated circuit for the purpose of preventing carriers from penetrating through the substrate to neighboring components. For example, in standard CMOS transistor processing, an isolation trench is etched into a semiconductor substrate and a liner is formed in the trench by oxidation. The liner oxidation is carried out for a number of reasons including rounding of the trench corner to provide better breakdown characteristics, formation of a high quality dielectric layer, creating a trench structure which is easy to fill, passivation of damage from the RIE (reactive ion etching), minimization of effects of contamination and improvement of the electrical characteristics of the trench isolation.

As shown in FIG. 4, a second pad nitride hard mask 196 is formed over the first pad nitride hard mask 188. The second pad nitride hard mask 196 fills the slot 198 and acts as a plug 174. The deposition of the second pad nitride hard mask 196 protects the slot 198 during subsequent operations. The sequence of the CMOS Active area 184 and the waveguide 182 may vary, for example, if slab(s) 212 are not desired, then the process of etching the CMOS active area 184 can be used to remove all silicon and the slot etching process of the waveguide 182 can be skipped entirely. The width of the slot 198 must be two times less than the thickness of the second pad nitride hard mask 196 to ensure that slot 198 fills with the second pad nitride hard mask 196.

Figure 5:
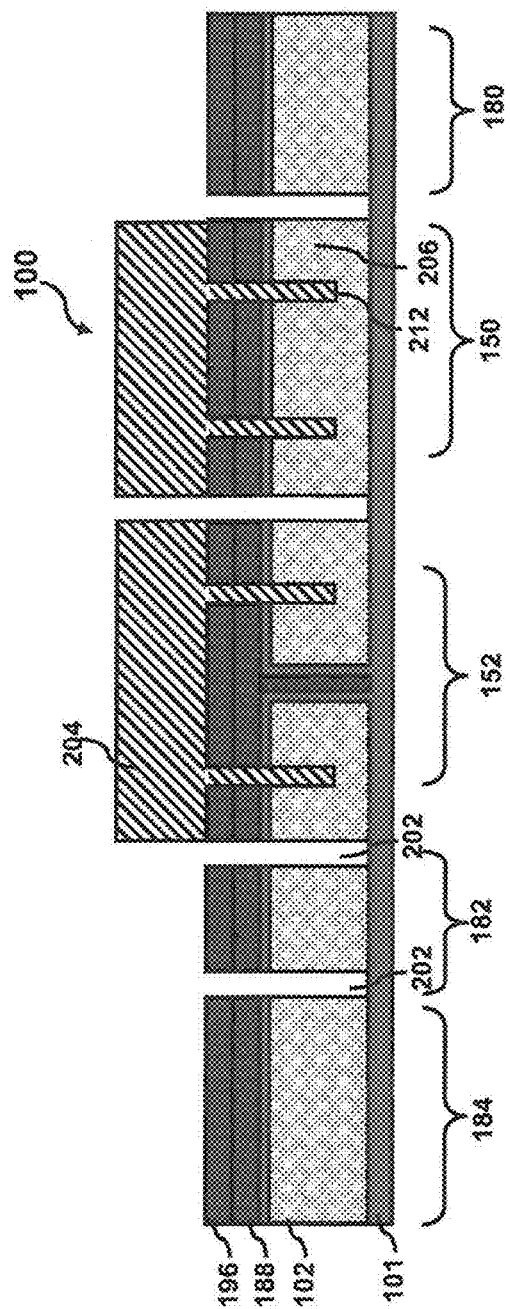
Figure 6:
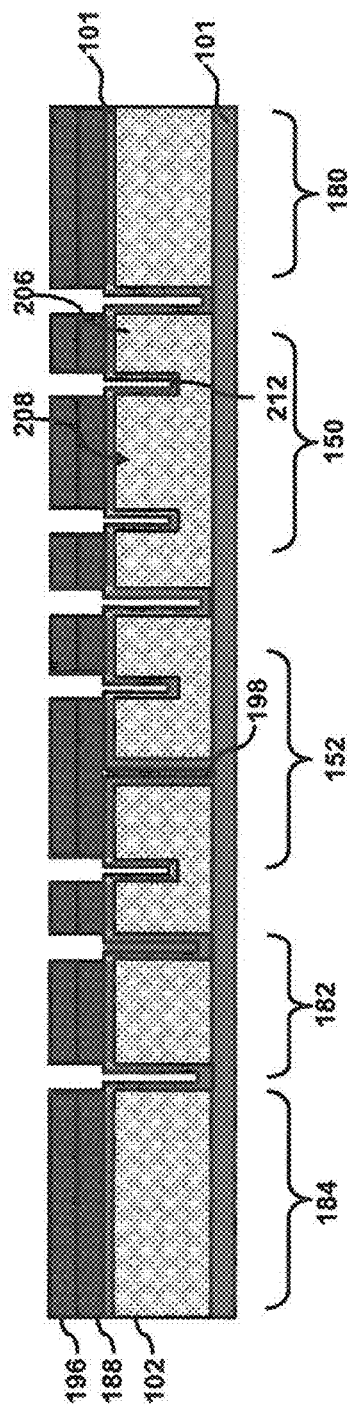

FIGS. 5-8 illustrate cross sectional views of the CMOS wafer 100 showing the steps involved in the formation of implants for the ring modulator 150 and the slot modulator 152 in the standard CMOS process. As shown in FIG. 5, a Waveguide Slot (WS) mask 204 is formed over the slot modulator 152 and the ring modulator 150. The WS mask 204 acts as a resistant to WS etching process. The WS etching completes silicon etch for the regions 202 of the CMOS active area 184 and the waveguide 182. The silicon slab(s) 212 need not be bound by raised pedestal(s) 206. The pedestal(s) 206 can be utilized for making contacts. The second pad nitride hard mask 196 serves as a hardmask and is thinned during WS etching process. Then, the liner oxidation of the CMOS wafer 100 is performed as shown in FIG. 6. FIG. 6 also shows the silicon ridge 208, the pedestal(s) 206 and silicon slab(s) 212 of ring modulator 150. After forming a photo resistant implant mask 214 over the second pad nitride hard mask 196 as shown in FIG. 7 and FIG. 8, a N type ion implant 216 followed by a P type ion implant 217 are formed on the slot and ring modulators 152 and 150 respectively. The WS mask 204 protects the slot 198 and the photo resistant implant mask 214 protects the regions other than the implant regions during, the CMOS process.

FIG. 9 and FIG. 10 illustrate cross sectional views of the CMOS wafer 100 showing the Shallow Trench Isolation (STI) filling and trench planarization process, in accordance with the disclosed embodiments. After removing the WS mask 204, the trenches 177 are filled with insulating material 103 using high-density plasma (HDP). After STI, the excess insulation material 103 can be removed from the wafer 100 using a planarization method such as chemical-mechanical planarization. Note that the insulating material 103 can be for example the material used in the oxide layer 101.

In general, high-quality Silicon dioxide (SiO2) is a dielectric utilized for isolation between the active devices. Shallow trench isolation (STI), also known as Box Isolation Technique, is an integrated circuit feature which prevents electrical current leakage between adjacent semiconductor device components. STI is generally used on CMOS process technology nodes of two hundred and fifty nanometers and smaller. STI is created early during the semiconductor device fabrication process, before transistors are formed. The STI process involve etching a pattern of trenches in the silicon, depositing one or more dielectric materials (such as silicon dioxide) to fill the trenches, and removing the excess dielectric using a technique such as chemical-mechanical planarization. For CMOS nodes below one hundred and eighty nanometers, shallow-trench isolation (STI) is the preferred electrical isolation scheme.

FIG. 11 illustrates a cross sectional view of the CMOS wafer 100 showing the process of stripping first and second pad nitride hard masks 188 and 196, in accordance with the disclosed embodiments. Sac oxidation preclean and sac oxidation process can be utilized for stripping first and second pad nitride masks 188 and 196. Sac oxidation preclean and sac oxidation process can reduce optical loss by smoothing the sidewalls of substrate 102. Then as shown in FIG. 12, by utilizing the standard CMOS process, an N type ion implant 250 can be formed on the top of the slot modulator 152. The implant for the ring modulator 150 can also be formed at this stage in the region 257 as shown.

Figure 13:
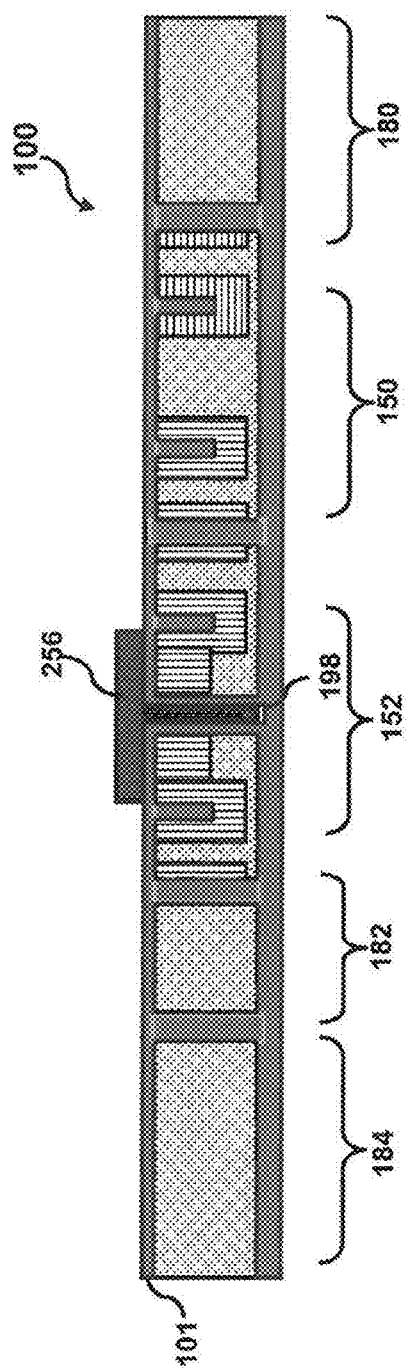
FIG. 13 illustrates a cross sectional view of the CMOS wafer showing the deposition of the plug nitride on the slot, in accordance with the disclosed embodiments.

As shown in FIG. 13, the slot 198 can once again be filled with the nitride material 256 which acts as a plug. The nitride material and plug nitride can be generally referred by the same reference numeral 256. The width of the slot 198 must be two times less than the thickness of the plug nitride 256 to ensure that the slot 198 fills with the nitride material 256. Note that, the plug pattern is not limited to only over the slot regions. Use over any region is to be open after metal line formation. Nitride is preferred as plug material as it can be isotropically removed with hot phosphoric acid. Other plug removal methods and other plug materials can also be used without limitation.

Figure 14:
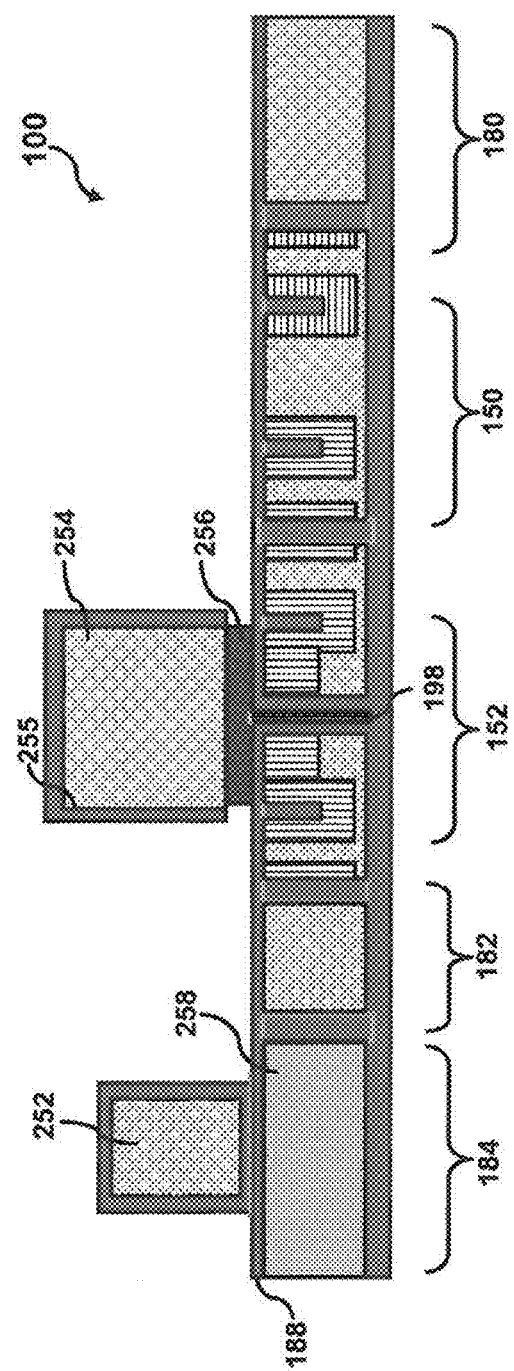
FIG. 14 illustrates a cross sectional view of the CMOS wafer showing the deposition of a polysilicon plug over the nitride plug, in accordance with the preferred embodiments.

FIG. 14 illustrates a cross sectional view of the CMOS wafer 100 showing the deposition of the polysilicon plug 254 over the plug nitride 256, in accordance with the preferred embodiments. The polysilicon plugs 252 and 254 are formed over a PolyBenzOxazole (PBO) doped Silicon 258 of the CMOS active area 184 and the plug nitride 256 respectively. The polysilicon plug 254 overlaps the plug nitride 256 to prevent stringers at the edge of the plug nitride 256. Any nitride stringers residuals at the nitride edge could lift and become a particle problem. The polysilicon plug 254 serves as an extra etch stop layer 255 and can be replaced by another layer at this point or later in processing. Use of polysilicon plug 254 minimizes the CMOS operations and processing.

The plug nitride 256 preserves the slot 198, so that the slot 198 may be opened at the end of the line. The nitride plug 256 also serves as an etch stop, when later exposing the nitride plug 256 and clearing out the slot 198. The CMOS gate material (not shown) may also be patterned over the nitride plug 256, when additional material is needed as an etch stop. Pattering the gate material over the nitride plug 256, may be performed during the standard gate patterning operation, and requires no new masks or processing steps. A separate etch stop material may be deposited and patterned after the gate formation, but using the same gate layer saves a mask.

Figure 19:
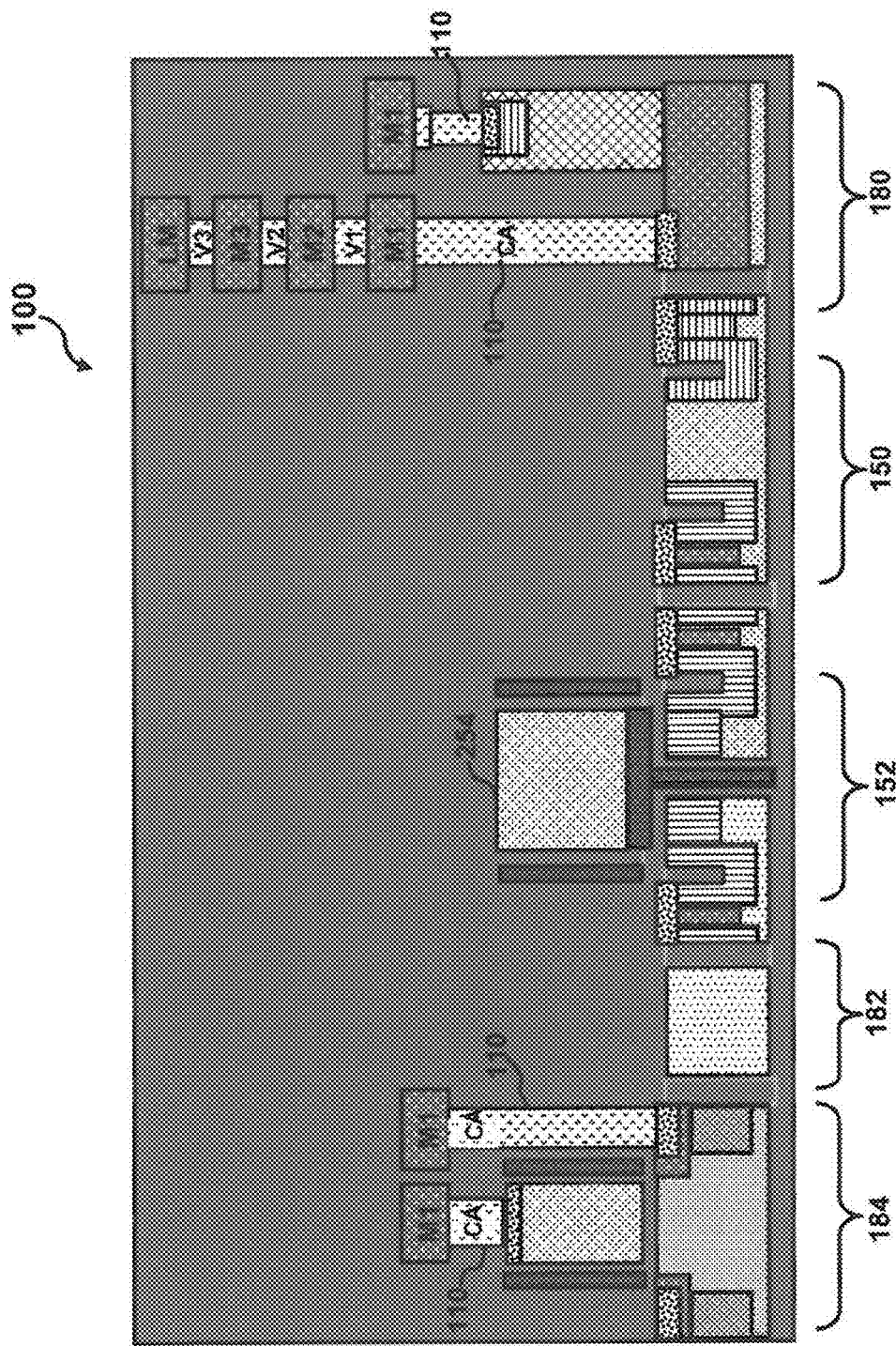

FIGS. 15-19 illustrate cross sectional views of the CMOS wafer 100 showing the process involved in the formation of the CMOS active area 184, the germanium detector 180, the slot modulator 152 and the ring modulator 150 using the standard CMOS process. As shown in FIG. 15, an N halo implant 260 and an $N^+$ source/drain implant 262 for the CMOS active area 184 are formed. Also $P^+$ contacts 264 for the slot modulator 152 and the nitride spacers 251 and 253 are formed as shown. Then as illustrated in FIG. 16, the CMOS wafer 100 is annealed and the salicide layers 270 are formed over the CMOS active area 184, the slot modulator 152, the Germanium detector 180 and the ring modulator 150. Passivation oxide deposition and chemical mechanical polishing are then performed as shown in FIG. 17 such that the nitride spacers 251 and 253 remain over the CMOS active area 184 and the slot modulator 152. After polishing, the oxide layer 101 covers the top of the poly etch stop layer 255, which is thirty five hundred Angstrom above the CMOS active area 184. FIG. 18 shows the formation of the germanium detector 180 using the standard CMOS process. Then as shown in FIG. 19, CA contacts 110, the metal layers M1, M2, M3 and ML and the vias V1, V2 and V3 are completed using the standard CMOS process.

Figure 20:
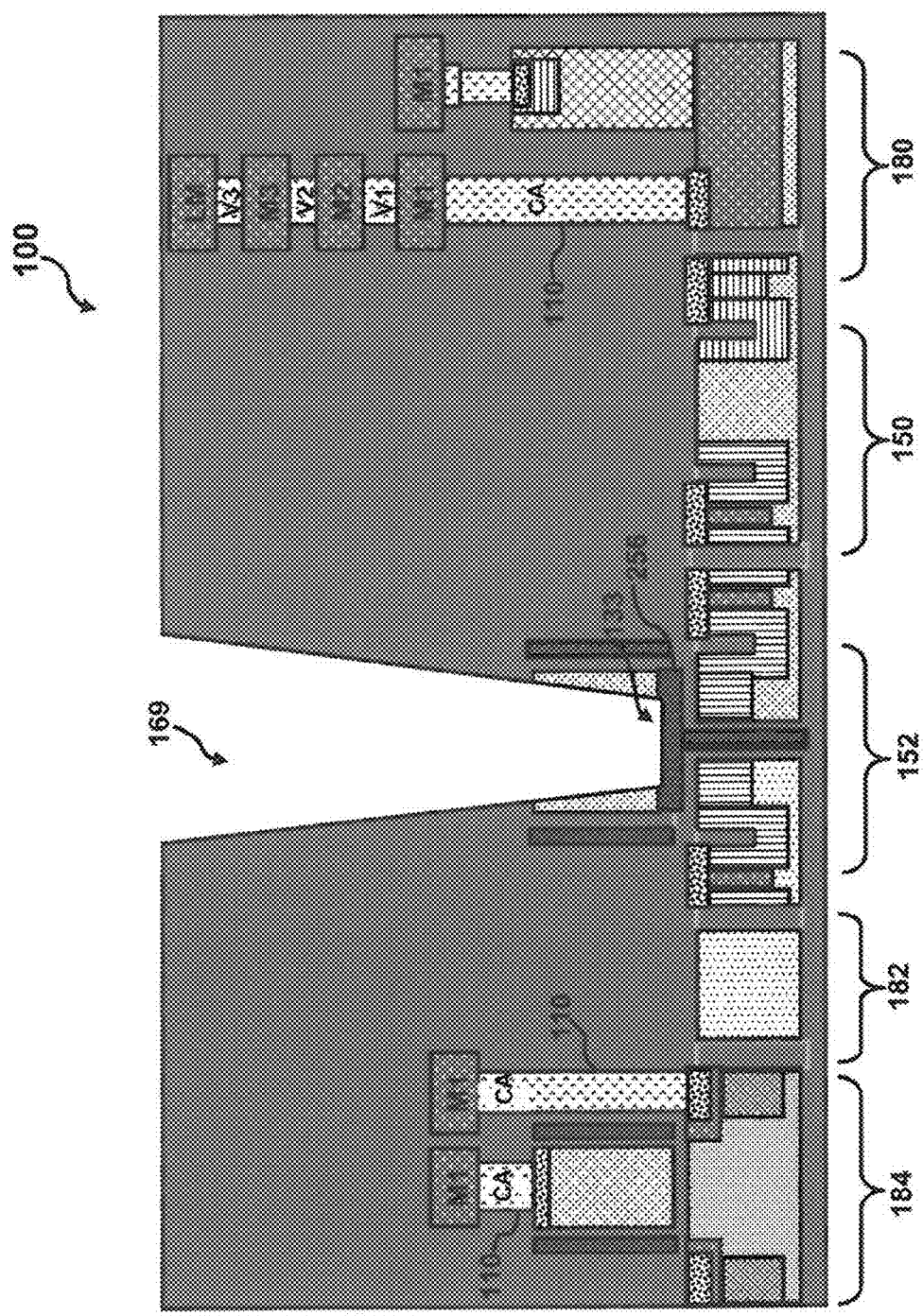
FIG. 20 illustrates a cross sectional view of the CMOS wafer showing the slot open etching process, in accordance with the disclosed embodiments.
Figure 21:
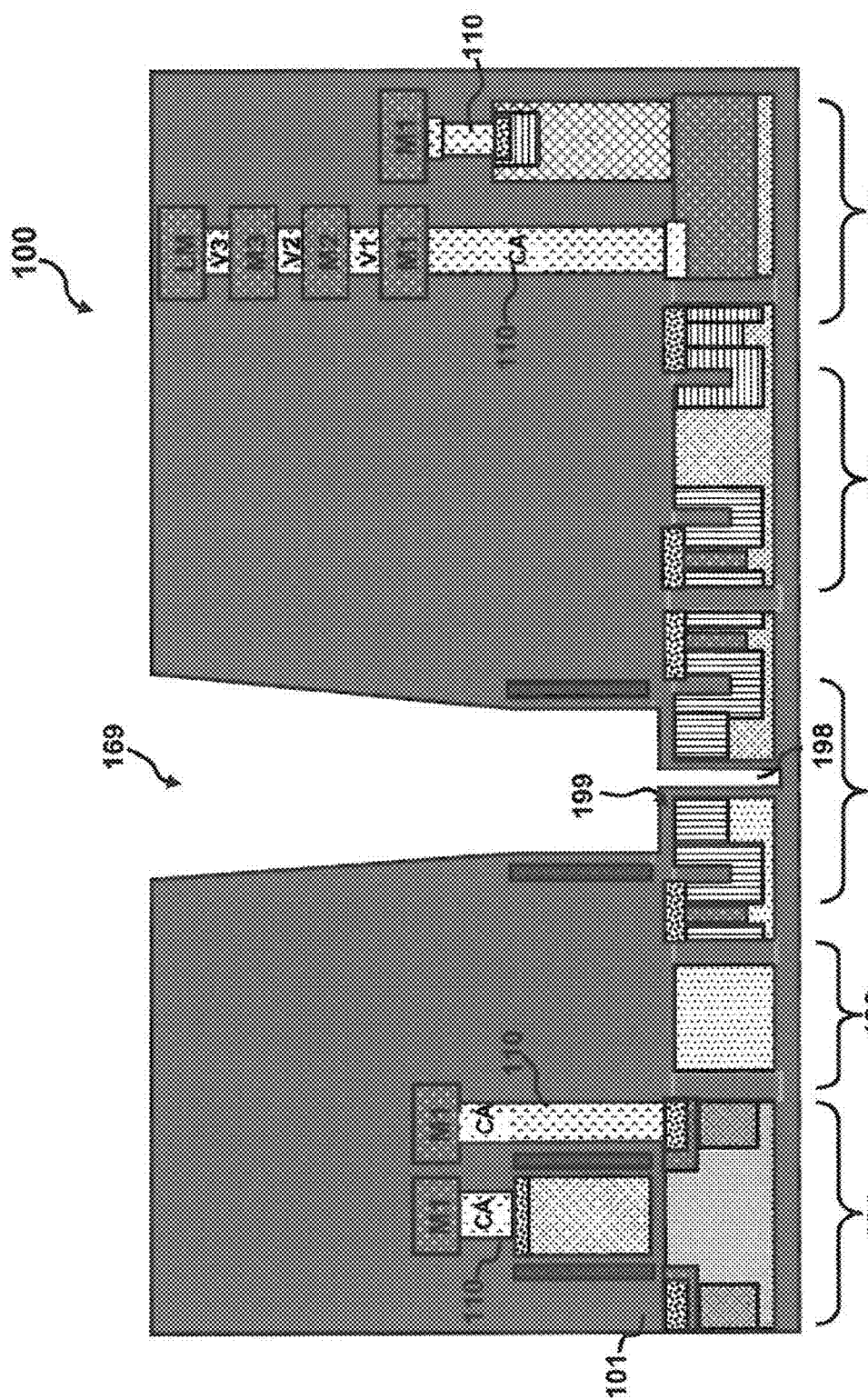
FIG. 21 illustrates a cross sectional view of the CMOS wafer showing the nitride plug removal process, in accordance with the disclosed embodiments.
Figure 22:
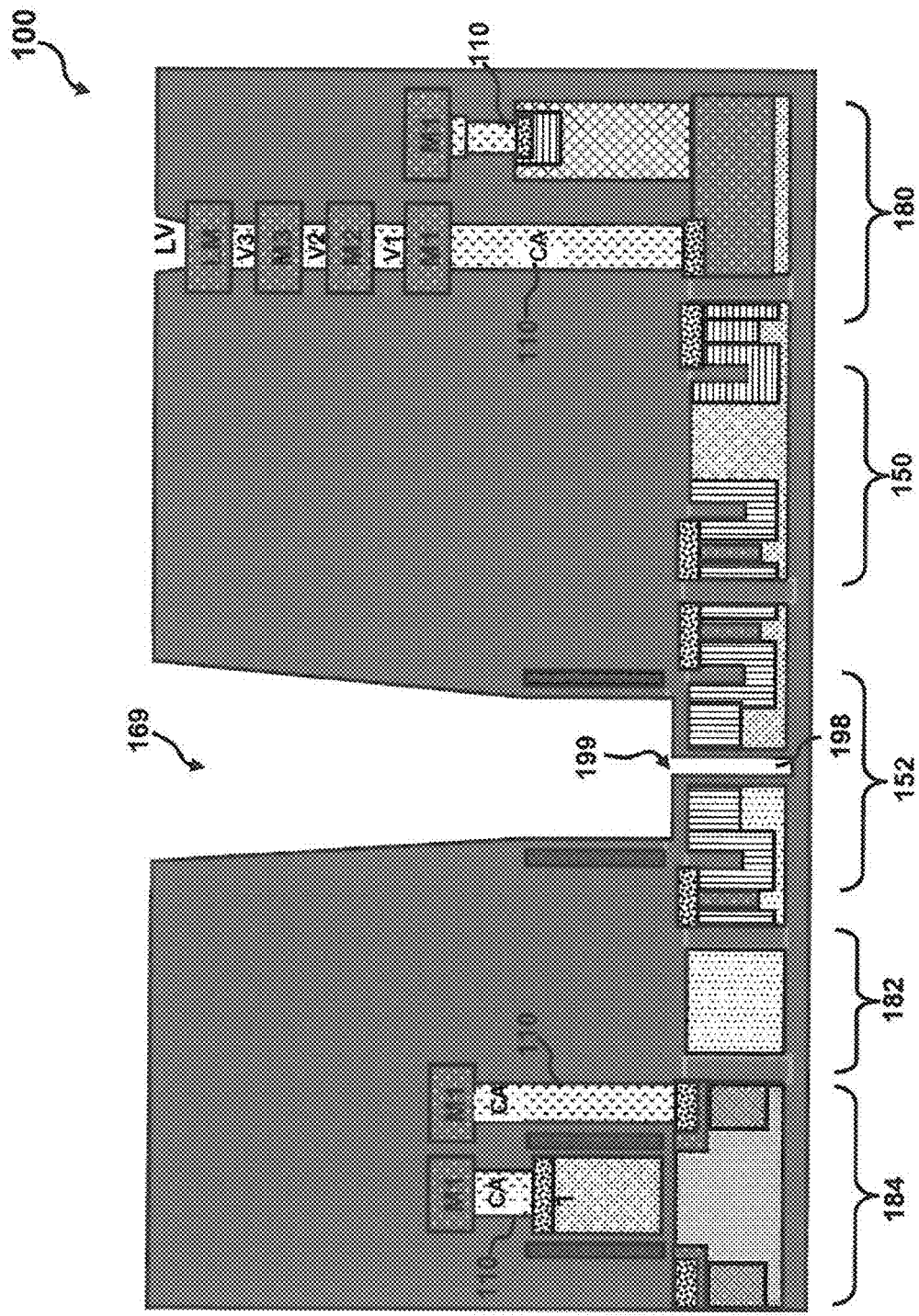
FIG. 22 illustrates a cross sectional view of the CMOS wafer showing a last via patterning process of the germanium detector, in accordance with the disclosed embodiments.

FIG. 20 illustrates a cross sectional view of the CMOS wafer 100 showing the slot open etching process, in accordance with the disclosed embodiments. After forming one or more electronic and photonic devices for example, the slot modulator 152, the ring modulator 150, the Germanium detector 180 and the FET 184 on the wafer 100, the slot opening 169 can be formed over the plug shapes 133. The plug shapes 133 covers the full thickness of the SOI, silicon slabs or field regions and does not enclose slot 198. Note that the silicon layer over the plug nitride 256 serves as an added etch stop layer 255 and is not required, when there is already sufficient selectivity to the underlying nitride plug 256. As in FIG. 21, the plug nitride 256 is removed by using hot phosphoric acid method. The nitride stripping process will remove all exposed plug nitride 256, so only the oxide layer 101 will remain on the top of the silicon mesas 199 and the sides of the slot 198. Finally, as illustrated in FIG. 22 a last via LV is patterned over a last metal LM.

Figure 23:
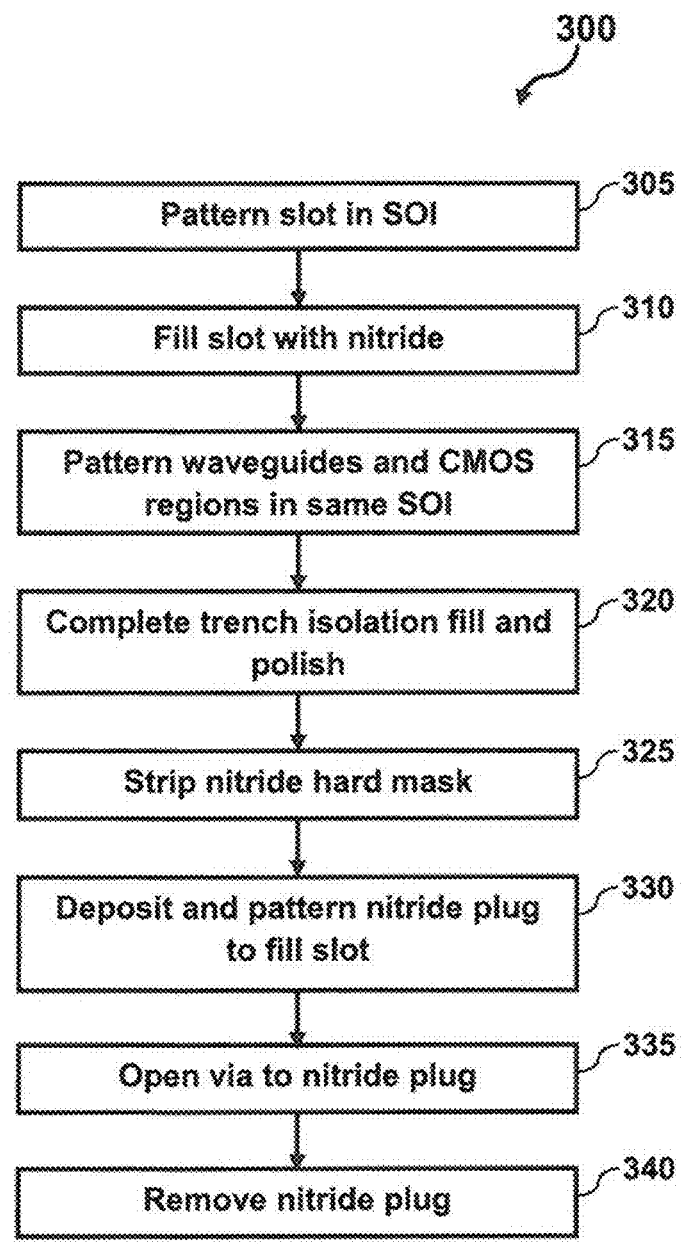
FIG. 23 illustrates a flow chart illustrating the processes involved in the formation of a slotted waveguide in the CMOS process, in accordance with the disclosed embodiments.

FIG. 23 illustrate a flow chart showing a process 300 involved in the formation of a slotted waveguide into a CMOS process, in accordance with the disclosed embodiments. The SOI substrate is patterned to form a slot as illustrated at block 305, by etching a first pad nitride hard mask deposited over the substrate. A second pad nitride hard mask can then be deposited over the first pad nitride hard mask such that the second pad nitride hard mask material fills the slot, as said at block 310. The waveguide and the CMOS regions can be patterned in the same substrate as said at the block 315. After patterning, the trenches are filled with an isolation material and the excess isolation material can then be removed by polishing the substrate as depicted at block 320. The nitride is deposited in the slot as a plug and then patterned once again as illustrated at block 330, after striping of the first and second nitride hard mask as said at block 325. At this stage, as the slot is closed with the plug nitride, one or more electronic and photonic devices can be formed by using the standard CMOS process. Finally as depicted at blocks 335 and 340, a via is opened till the nitride plug and the nitride plug is removed.

The process 300 can be integrated with the standard CMOS process to fabricate both electronic and photonic devices on the same substrate. The process 300 creates slotted waveguides along sides other photonic and CMOS devices, where the slotted waveguide is opened at the end of the process. Since the waveguide is opened at the end, a variety of films maybe deposited into the slot, such as an electro-optic polymer. The process also allows for other opening to the tops of waveguides, which enables bonding of optical sources and detectors to the waveguides.

It will be appreciated that variations of the above disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for integrating a slotted waveguide with a complementary metal-oxide-semiconductor (CMOS), said method comprising:
    patterning a slot in a silicon-on-insulator (SOI) wafer utilizing a patterning technique;
    filling said slot with a nitride compound;
    patterning at least one waveguide region and at least one CMOS region in said SOI wafer;
    completing a trench isolation fill and polish back on said SOI wafer;
    stripping a nitride hard mask, wherein stripping a nitride hard mask etches said nitride compound in said slot to form a patterned slot area;
    depositing and patterning a nitride plug to fill the patterned slot area, and thereafter, performing CMOS and photonic fabrication on said SOI wafer;
    forming a via to said nitride plug; and
    removing said nitride plug in the patterned slot area to form an opening of said slotted waveguide.

2. The method of claim 1 further comprising integrating said slotted waveguide alongside a photonic device and a CMOS device; and wherein said removing said nitride plug in the patterned slot area to form an opening of said slotted waveguide is performed at the end of the method.

3. The method of claim 1 wherein said nitride plug prevents forming said opening of said slotted waveguide during said performing CMOS and photonic fabrication on said SOI wafer.

4. The method of claim 1 further comprising employing said nitride plug as an etch stop during said forming a via to said nitride plug.

5. The method of claim 1 further comprising patterning a CMOS gate over said nitride plug to serve as an etch stop.

6. The method of claim 5 further comprising patterning a CMOS layer on said nitride plug via a standard gate patterning process to form said CMOS gate.

7. The method of claim 1 further comprising depositing and patterning a separate etch stop material on a CMOS gate and utilizing said CMOS gate as a mask.

8. The method of claim 1 further comprising enabling bonding of at least one optical source and at least one detector to said slotted waveguide.

9. A product formed by the method for integrating a slotted waveguide with a complementary metal-oxide-semiconductor of claim 1.

10. A method for integrating a slotted waveguide with a complementary metal-oxide-semiconductor (CMOS), said method comprising:
    patterning a slot in a silicon-on-insulator (SOI) wafer utilizing a patterning technique;
    filling said slot with a nitride compound;
    patterning at least one waveguide region and at least one CMOS region in said SOI wafer;
    completing a trench isolation fill and polish back on said SOI wafer;
    stripping a nitride hard mask, wherein stripping a nitride hard mask etches said nitride compound in said slot to form a patterned slot area;
    depositing and patterning a nitride plug to fill the patterned slot area, and thereafter, performing CMOS and photonic fabrication on said SOI wafer, including integrating said slotted waveguide alongside a photonic device and a CMOS device;
    wherein said nitride plug prevents forming an opening of said slotted waveguide during said CMOS and photonic fabrication;
    forming a via to said nitride plug; and
    removing said nitride plug in the patterned slot area to form the opening of said slotted waveguide at the end of the method.

* * * * *